United States Patent [19]

Paik et al.

[11] Patent Number: 5,352,629

[45] Date of Patent: Oct. 4, 1994

[54] PROCESS FOR SELF-ALIGNMENT AND PLANARIZATION OF SEMICONDUCTOR CHIPS ATTACHED BY SOLDER DIE ADHESIVE TO MULTI-CHIP MODULES

[75] Inventors: Kyung W. Paik, Clifton Park; William A. Hennessy, Niskayuna; Wolfgang Daum, Schenectady, all of N.Y.

[73] Assignee: General Electric Company, Schenectady, N.Y.

[21] Appl. No.: 6,297

[22] Filed: Jan. 19, 1993

[51] Int. Cl.⁵ .................. H01L 21/52; H01L 21/56; H01L 21/603
[52] U.S. Cl. .................. 437/189; 437/212; 437/216; 437/222; 257/779; 257/783
[58] Field of Search .............. 437/189, 212, 216, 222; 228/123, 180.2, 254; 29/834, 840; 257/783, 772, 779

[56] References Cited

U.S. PATENT DOCUMENTS

| | | | |
|---|---|---|---|
| 3,401,126 | 9/1968 | Miller et al. | 252/518 |
| 3,424,040 | 2/1969 | Miller et al. | 29/840 |
| 3,869,787 | 3/1975 | Umbaugh | 29/464 |
| 3,887,760 | 6/1975 | Krieger et al. | 228/180.2 |
| 3,919,709 | 11/1975 | Koenig | 437/209 |
| 4,783,695 | 11/1988 | Eichelberger et al. | 357/65 |
| 4,810,671 | 3/1989 | Bhattacharyya et al. | 228/123 |
| 4,933,042 | 6/1990 | Eichelberger et al. | 156/239 |
| 5,037,778 | 8/1991 | Stark et al. | 228/123 |
| 5,043,296 | 8/1991 | Hacke et al. | 437/205 |
| 5,051,811 | 9/1991 | Williams et al. | 257/779 |
| 5,101,550 | 4/1992 | Dunaway et al. | 29/760 |
| 5,181,648 | 1/1993 | Leicht | 228/201 |

FOREIGN PATENT DOCUMENTS

| | | | |
|---|---|---|---|
| 54-131872 | 10/1979 | Japan | 437/212 |
| 1309343 | 12/1989 | Japan | 437/212 |
| 414852 | 1/1992 | Japan | 257/779 |
| 8803705 | 5/1988 | PCT Int'l Appl. | 257/783 |

OTHER PUBLICATIONS

"Polyimide Preform for Polyimide Film Chip Carrier", Research Disclosure No. 283, Nov. 1987, Kenneth Mason Publications Ltd., England.

"Alignment Fixture for MCM Assembly", Research Disclosure No. 332, Dec. 1991, Kenneth Mason Publications Ltd., England.

Microelectronic Packaging Handbook, Edited by R. Tummala, et al 1989, Van Nostrand Reinhold, pp. 366–447.

Electronic Packaging and Interconnection Handbook by C. A. Harper, 1991, McGraw-Hill, Inc., p. 7.21.

*Primary Examiner*—Olik Chaudhuri
*Assistant Examiner*—David E. Graybill
*Attorney, Agent, or Firm*—Brian J. Rees; Geoffrey H. Krauss

[57] ABSTRACT

A method for attaching a chip to a substrate includes providing the substrate with an outer layer of an electrical conductor which is not wettable by solder and which has a window exposing an inner layer of electrical conductor that is wettable by solder. A solder preform is placed on the window exposing the inner layer, and the chip is placed on the solder preform. The substrate is then heated so as to melt the solder preform. To achieve planarity, the substrate is be positioned in a pressurizing chamber with a film overlay having higher pressure above the film overlay than underneath the overlay, and heated above the melting point of the solder.

12 Claims, 3 Drawing Sheets

PROCESS FOR SELF-ALIGNMENT AND PLANARIZATION OF SEMICONDUCTOR CHIPS ATTACHED BY SOLDER DIE ADHESIVE TO MULTI-CHIP MODULES

BACKGROUND OF THE INVENTION

1. Field of the Invention

This invention relates generally to the placement of semiconductor chips in multi-chip modules, and, more particularly, to chip alignment in multi-chip modules using solder die adhesives.

2. Description of the Related Art

Die attachment using various types of adhesives is an important process step in multi-chip module (MCM) manufacturing. Most widely used die attach adhesives are polymers, such as epoxy-based or polyimide-based adhesives. These polymer-based adhesives are further classified into electrically conducting and non-conducting adhesives, depending on the presence of conductive powders in the polymers. Conventional die attachment sequences are discussed in C. A. Harper, Electronic Packaging and Interconnection Handbook, McGraw-Hill, Inc. (1991), pp. 7.21–7.27.

The die attach process using polymer adhesives requires many steps: dispensing adhesive; removing solvent; automated die placement; and adhesive curing. Commonly assigned C. W. Eichelberger et al., U.S. Pat. No. 4,783,695, issued Nov. 8, 1988, describes techniques for die attachment for high density interconnect (HDI) modules, and is herein incorporated by reference. For compatibility with HDI fabrication steps, the die attach process must be performed with great precision using a die pick-and-place machine, and inter-die height variations must be minimized. Co-planar die attachment is key to the successful execution of post-attachment MCM interconnect processes.

For some applications, such as power converter/power control MCMs that include the attachment of vertically scaled components, which require both high chip-to-substrate thermal conduction and low chip-to-substrate metal contact resistance, use of polymer-based die attach adhesives is impractical because of poor thermal and electrical conductivity characteristics. Epoxy-based adhesives can have better thermoconductivity properties than polyimide-based adhesives, but if epoxy-based adhesives are exposed to air and absorb moisture, they exhibit reliability deficiencies such as loss of adhesion and loss of electrical conductivity due to the oxidation of metal conductor powders. Aforementioned U.S. Pat. No. 4,783,695 discloses a method of eutectic die bonding, in which a gold germanium solder preform is placed between a chip and a substrate and heated, but does not disclose a method for alignment or planarization of chips.

Chapter 6.3 of Microelectronics Packaging Handbook, edited by R. Tummala and E. Rymaszewski, Van Nostrand Reinhold (1989), discloses a method for chip-to-substrate interconnection and alignment using patterned solder bumps. A matrix of solder bumps is formed on an MCM substrate and a corresponding matrix is formed on chip pads. Then the solder bumps of the substrate and chip are placed in contact while being heated, and the solder forms interconnections between the chip and substrate. This technique requires a significant amount of precision in chip placement on the substrate because if a misalignment exceeds an acceptable range the surface tension of molten solder will not be great enough to offset the misalignment and the solder interconnection will be disrupted.

SUMMARY OF THE INVENTION

Accordingly, one object of the invention is to provide a die adhesive with higher thermal conductivity and lower electrical resistivity than heretofore available, thus allowing for the attachment of vertically scaled electrical components into a multi-chip module configuration.

Another object of the invention is to provide a self-aligning technique for chips on a designated area of substrate using solder die attach adhesives.

Still another object of the invention is to provide a method for planarizing chips attached by solder die attach adhesives for subsequent processing.

Briefly, in accordance with a preferred embodiment of the invention, a method for attaching a chip with a metallized backside to a substrate comprises providing the substrate with a patterned outer layer of an electrical conductor having solder nonwettability and a window exposing an inner layer of electrical conductor having solder wettability. A solder preform is placed on the window exposing the inner layer. The chip is next placed on the solder preform, and the substrate is heated so as to melt the solder preform. Planarization of solder-attached chips may then be performed by applying pressure between the chips and substrate and reflowing the solder.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, with like numerals representing like components, in which:

DETAILED DESCRIPTION OF A PREFERRED EMBODIMENT OF THE INVENTION

Figure 1B:
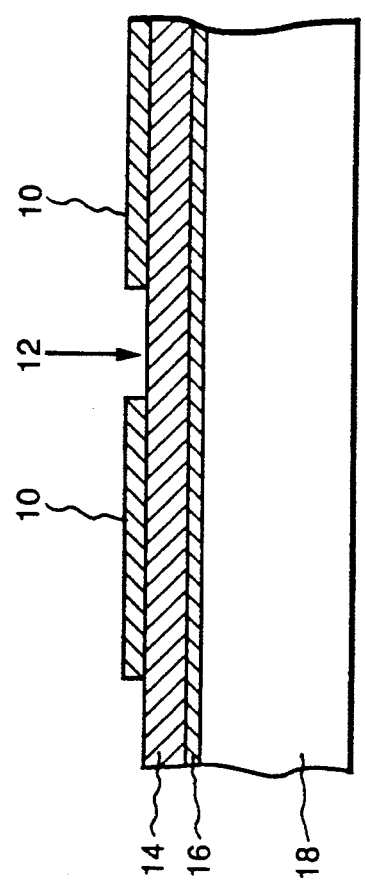
FIG. 1(b) is a sectional side view of the configuration of FIG. 1(a), which further shows the electrically conductive layers supported on a substrate.

FIG, 1(a) is a top plan view of an outer electrically conductive layer 10 on a substrate 18 having solder nonwettability and having windows 12 exposing an inner electrically conductive layer 14 having solder wettability. FIG, 1(b) is a sectional side view of the configuration of FIG. 1(a), which further shows an optional electrically conductive layer 16 on the surface of substrate 18. In applications involving high density interconnect (HDI), chip wells 40, as shown in FIG. 2, may be employed. Preferably chip wells 40 are milled to appropriate depths so that the end result will be that all the chips, which may have different heights, are substantially planar.

Substrate 18 may comprise any structural material, and, in a preferred embodiment, comprises a ceramic such as alumina. Optional layer 16 can comprise any material which adheres to substrate 18 and provides a surface over which inner layer 14 may be applied. In one embodiment, optional layer 16 comprises 0.1 $\mu$m titanium, inner layer 14 comprises 4 $\mu$m copper, and outer layer 10 comprises 0.1 $\mu$m titanium. One preferred method of applying all three layers is to use a separate sputtering step for each layer.

Figure 1A:
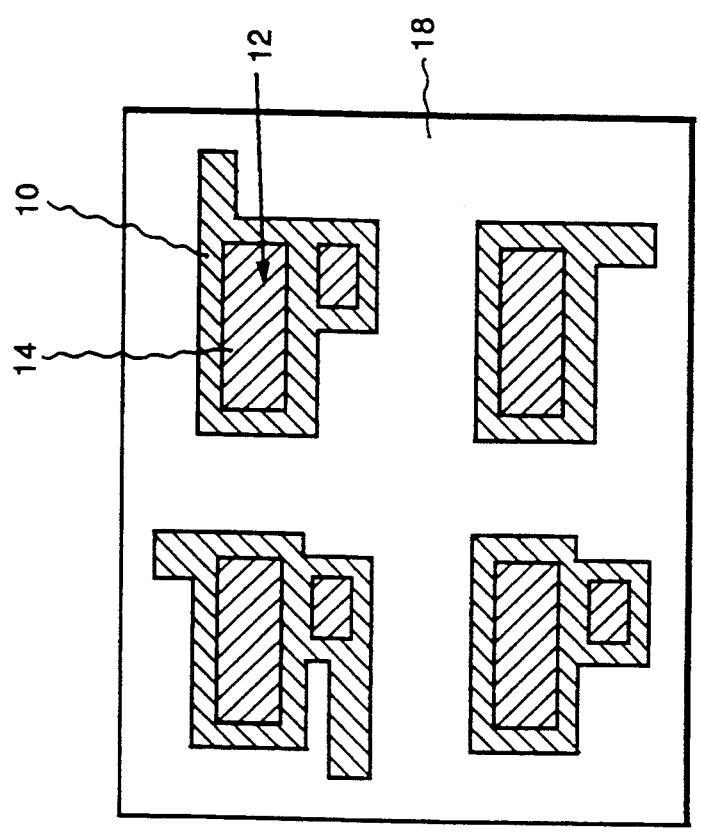
FIG. 1(a) is a top plan view of an outer electrically conductive layer having solder nonwettability and having windows exposing an inner electrically conductive layer having solder wettability.
Figure 2:
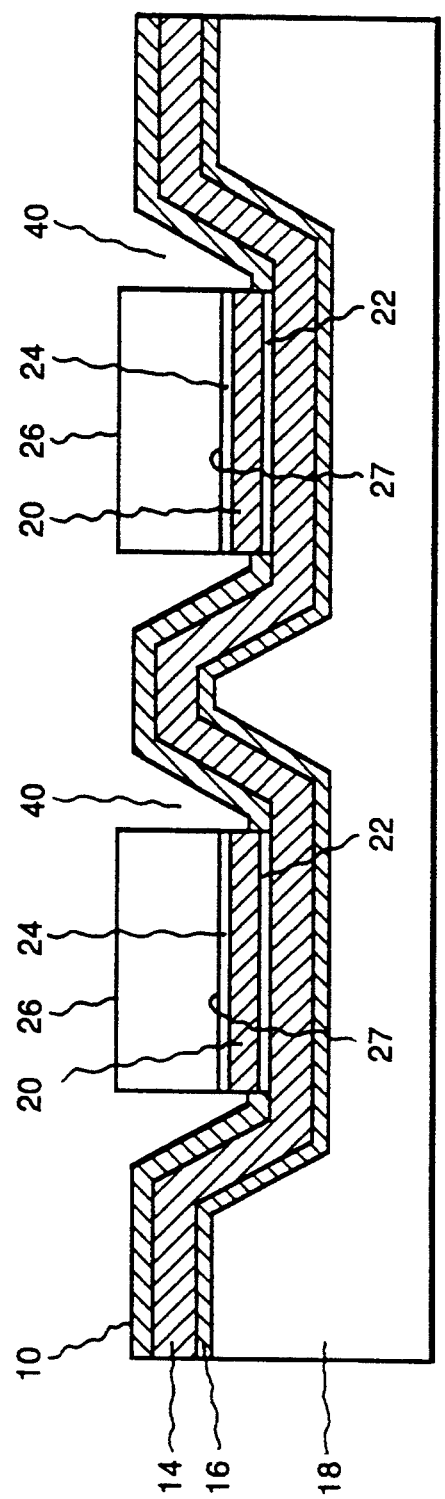
FIG. 2 is a sectional side view of substrate having chip wells and covered by an outer electrically conductive layer having solder nonwettability and a window exposing an inner electrically conductive layer having solder wettability in which a chip is placed before solder reflowing on a flux-covered solder preform situated on the flux-covered chip well.

A combination of photolithographic and aqueous etch steps may be employed to selectively remove outer layer 10 to expose inner layer 14 windows 12 (FIGS. 1(a) and 1(b)). A photoresist (not shown) can be applied, and then selectively exposed and developed so as to leave resist everywhere except on the surfaces of inner layer 14 exposed by windows 12. If there are chip wells involved, the resist is also patterned to cover the walls of those wells. Outer layer 10 is then etched away in the window areas by applying a hydrofluoric acid solution. Then the photoresist is removed and the layers are ready for further processing.

FIG. 2 is a view similar to that of FIG. 1(b), with the addition of a chip 26 placed on a solder preform 20 and several optional layers of solder flux 22 and 24 in a chip well 40. As is normally the case for vertically scaled components, the underside 27 of chip 26 will be coated with a layer of solderable metal (e.g., Cr/Ni/Ag or Cr/Ni/Au).

Various types of solder may be used. In one embodiment a solder of 97.5% lead, 1% tin, and 1.5% silver, which is commercially available from solder vendors, is used because its relatively high melting temperature (309° C.) makes it compatible with subsequent HDI processing temperatures. Solder preforms 20 substantially replicate the length and width dimensions of the chips to be attached and are typically 1 mil thick.

In one embodiment, once the substrate with windows 12 and the solder preforms have been fabricated, a small amount of first solder flux 22, such as Rosin Mild Active (RMA) solder flux, may be applied on layer 14 through window 12. A preform 20 is then placed on the flux covered window and a second layer of solder flux 24 is coated on solder preform 20. Then chip 26 is placed on the flux-coated preform. In an alternative embodiment, solder preform 20 may be precoated with flux material on either one or both sides. Due to the self-aligning nature of the solder reflow process, the placement of solder preform 20 and chip 26 does not have to be as precise as in the case of a polymer-based die attach adhesive using an automated pick-and-place machine.

Optimal performance has been achieved when the dimensions (length and width) of each window 12 and each solder preform 20 were identical to the dimensions of a respective chip which was placed in the window. However, it is possible to use different dimensions. For example, if the preform is longer or wider than the window, after reflow the solder layer will have increased thickness. Solder preforms are not always flat as shown in FIG. 2, and need not be flat for the alignment to be achieved.

After chip 26 is in position, the substrate is moved to a heat source, preferably a heat plate which in one embodiment is heated at 350° C. An oven or other heating mechanism may alternatively be used; the important feature is the ability to heat the solder to reflow. Blowing of an inert gas, such as nitrogen, is useful in order to prevent oxidation of inner layer 14 during solder reflowing. Once the surface temperature of substrate 18 reaches the solder melt point, the solder will start melting and wet only inner layer 14 exposed by window 12. The chips are self-aligned because of the balancing of the surface tension between each respective well-defined solder pool and the underside 27 of each respective chip.

After the solidification of solder, substrate 18 with attached chip 26 may be cleaned to remove any flux residue around the chip. For example, a methylene chloride based solvent may be applied. A preferred technique is ultrasonic organic cleaning, in which the substrate is placed in a container of solvent and the container of solvent is placed in a larger container of water and is vibrated with ultrasonic energy. The cleaned substrate is then ready for subsequent processing.

Solder preforms generally have a naturally-occuring oxide film on their surface which can cause further oxidation during heating. Although solder flux chemically removes oxide films, when the flux is not completely removed, it sometimes attracts water which results in subsequent corrosion of metals or damage to integrated circuits (ICs). The use of a solder preform without flux is possible when certain other techniques (which may be used on one or both surfaces of a solder preform) are used to prevent contamination due to the oxidation which may occur during solder flow.

For example, in one embodiment, a technique such as ultrasonic excitation or scrubbing may be used for providing a break in the oxide film during the solder flowing step. Surface tension between the solder and the surfaces of the chip and inner layer 14 in window 12 can remove any oxide film and cause the initial soldered surfaces to expand and cover the entire surfaces of the chip and window.

Another method which does not require solder flux includes the step of applying a forming gas, such as, for example, hydrogen, which reduces the oxide present and prevents further oxidation. This gas can be blown across the area of the solder during the entire soldering process. Alternatively, if the process is operated in a vacuum, the substrate may be prebaked in hydrogen to reduce oxide film buildup, and the hydrogen may then be pumped out before the solder flows.

Figure 3:
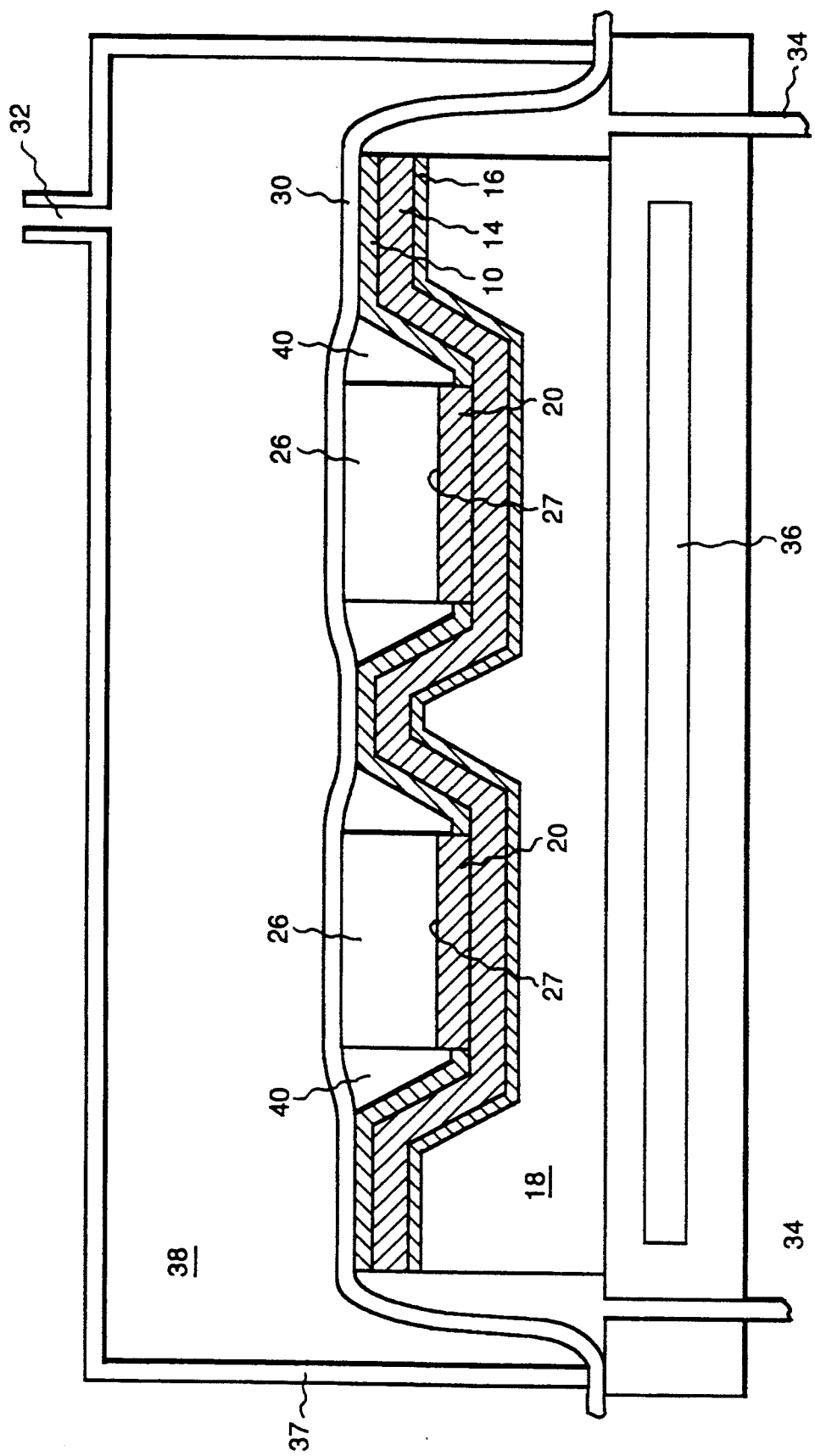
FIG. 3 is a sectional side view of a planarization chamber for correcting inter-chip height variations which may be present after the solder reflowing and flux removal of the configuration shown in FIG. 2.

FIG. 3 is a sectional side view of a planarization chamber for minimizing inter-chip height variations which may be present in the configuration shown in FIG. 2.

After chips are attached using the above described method, a piece of dielectric film 30, such as, for example, "Kapton" polyimide (Kapton is a trademark of E. I. duPont de Nemours and Co.), is extensively applied over chip 26, substrate 18, and the bottom of a pressure chamber 38, and then an upper part 37 of pressure chamber 38 may be placed over dielectric film 30, including substrate 18. A pressurizing mechanism (not shown) applies planarization pressure on film 30 through a conduit 32. Additionally, in a preferred embodiment of the invention, a vacuum is applied under the film through conduits 34 while the pressure is being applied from above. A method for performing the pressure and vacuum steps is disclosed in commonly assigned C. W. Eichelberger et al., U.S. Pat. No. 4,933,042, issued Jun. 12, 1992, which is herein incorporated by reference. In one embodiment, the vacuum is about 10 inches Hg and positive pressure is several PSI.

When pressures are stabilized, the substrate is heated with a heater 36 above the melting temperature of the solder, typically to 320° C. through 340° C. When the solder reaches its melting point, a small amount of solder is squeezed out from the bottoms of the chips because of planarization pressure. If the chips are in chip wells, the squeezed-out solder enters any cavities between the side-walls of the chips and the chip wells. Preferably chip wells 40 have slanted sides, as shown in FIG. 3, so that solder squeezed out from the bottom of the chips may be easily removed.

After about two minutes at the solder melting temperature, the substrate is preferably cooled down to room temperature under vacuum conditions. Film 30 may then be removed, and substrate 18 may be water-jet sprayed to remove the loosely attached solder droplets between the chips and chip wells. After these steps, the modules are ready for further conventional HDI processing, such as polymer chip attach, laminations, and interconnect fabrication.

In an alternative embodiment, if an application requires planarization of chips but does not require strict alignment, an approach is to combine the above-discussed alignment and planarization methods but use only one heating step. After chip 26 is placed on second solder flux 24, as shown in FIG. 2, a film layer can be applied directly and substrate 18 may be placed in pressurizing chamber 38 for one heating step to planarize the chips. The alignment, however, is not as precise as if both heating steps, one for alignment and a separate one for planarization, were used.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for attaching at least one semiconductor chip, with an electrical conductor disposed on an underside of each of said at least one chip, to a substrate having a surface, to cause self-alignment and PLANARIZATION of said at least one chip, comprising:
   providing on said substrate surface an inner layer of electrical conductor having solder wettability;
   providing on said inner layer an outer layer of electrical conductor having solder nonwettability and having at least one window therein exposing said inner layer, said at least one window having a length and width substantially equal to an associated length and width of said at least one chip;
   placing a solder preform on each respective one of said at least one window;
   placing a chip on each respective one of said solder preforms;
   placing said substrate into a structure capable of applying isostatic pressure;
   overlaying said substrate and said at least one chip with a dielectric film layer;
   applying pressure over said dielectric film layer; and subsequently
   heating said substrate above the melting point of said solder preforms to align each of said at least one chip within said at least one window, and substantially simultaneously to planarize said at least one chip with respect to said surface.

2. The method of claim 1, further including the step of providing chip wells in said substrate prior to providing said substrate with said outer layer and said inner layer.

3. The method of claim 2, wherein the step of providing chip wells comprises providing chip wells with slanted sidewalls.

4. The method of claim 2, further including the step of applying a vacuum under said dielectric film layer during the step of applying pressure over said dielectric film layer.

5. The method of claim 4, wherein said dielectric film layer comprises a polyimide.

6. The method of claim 4, further including the step of cooling said substrate while still applying said vacuum after the step of heating said substrate.

7. The method of claim 4, further including the steps of cooling said substrate after the step of heating said substrate, and thereafter removing said dielectric layer.

8. A method for attaching at least one semiconductor chip, each with an electrical conductor disposed on an underside thereof, to a substrate having a surface, and having chip wells therein, causing chip attachment, chip alignment, and chip planarization substantially simultaneously, comprising:
   providing on said substrate surface an inner layer of electrical conductor having solder wettability;
   providing on said inner layer an outer layer of an electrical conductor having solder nonwettability and having at least one window therein exposing said inner layer, said at least one window having a length and width substantially equal to an associated length and width of said at least one chip;
   placing a solder preform on each respective one of said at least one window;
   placing a chip on each respective one of said solder preforms;
   placing said substrate into a structure capable of applying isostatic pressure;
   overlaying said substrate and said at least one chip with a dielectric film layer;
   applying pressure over said dielectric film layer; and subsequently
   heating said substrate above the melting point of said solder preforms to cause each of said at least one chip to be substantially simultaneously self-aligned within said at least one window and planarized with respect to said surface.

9. The method of claim 8, wherein
   the step of providing said outer layer having windows exposing said inner layer is performed so that each respective window has a length and width substantially equal to the length and width of a predetermined respective one of said chips; and
   the step of placing a solder preform on each respective one of said windows is performed so that each respective solder preform has a length and width substantially equal to the length and width of the respective window on which it is situated.

10. The method of claim 9, further including the step of applying a vacuum under said dielectric film layer during the step of applying pressure over said dielectric film layer.

11. The method of claim 10, wherein said chip wells have slanted sidewalls.

12. The method of claim 8, further including the steps of:

applying a first solder flux on said inner layer through said windows prior to placing said preforms in said windows; and applying a second solder flux on said solder preforms prior to placing said chips on said solder preforms.

* * * * *